(12) United States Patent
Wells

(10) Patent No.: US 7,177,888 B2
(45) Date of Patent: Feb. 13, 2007

(54) PROGRAMMABLE RANDOM BIT SOURCE

(75) Inventor: Steven E. Wells, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 667 days.

(21) Appl. No.: 10/633,096

(22) Filed: Aug. 1, 2003

(65) Prior Publication Data

US 2005/0027765 A1 Feb. 3, 2005

(51) Int. Cl.
G06J 1/00 (2006.01)
G06F 1/02 (2006.01)

(52) U.S. Cl. .......................... 708/3; 708/251
(58) Field of Classification Search .......... 708/3, 708/250–256
See application file for complete search history.

(56) References Cited

U.S. PATENT DOCUMENTS

| | | | |
|---|---|---|---|
| 3,790,768 A | 2/1974 | Chevaller et al. | |
| 4,578,649 A | 3/1986 | Shupe | |
| 4,694,412 A | 9/1987 | Domenik et al. | |
| 4,791,594 A | 12/1988 | Harney et al. | |
| 4,810,975 A | 3/1989 | Dias | |
| 4,855,690 A | 8/1989 | Dias | |
| 4,905,176 A * | 2/1990 | Schulz | 708/252 |
| 5,007,087 A | 4/1991 | Bernstein et al. | |
| 5,473,692 A | 12/1995 | Davis | |
| 5,539,828 A | 7/1996 | Davis | |
| 5,568,552 A | 10/1996 | Davis | |
| 5,627,775 A | 5/1997 | Hong et al. | |
| 5,706,218 A | 1/1998 | Hoffman | |
| 5,778,070 A | 7/1998 | Mattison | |
| 5,781,458 A | 7/1998 | Gilley | |
| 5,805,712 A | 9/1998 | Davis | |
| 5,828,753 A | 10/1998 | Davis | |
| 5,835,594 A | 11/1998 | Albrecht et al. | |
| 5,844,925 A | 12/1998 | Dent | |
| 5,844,986 A | 12/1998 | Davis | |
| 6,026,016 A | 2/2000 | Gafken | |
| 6,061,702 A | 5/2000 | Hoffman | |
| 6,065,029 A * | 5/2000 | Weiss | 708/251 |
| 6,104,811 A | 8/2000 | Aiello et al. | |

(Continued)

FOREIGN PATENT DOCUMENTS

DE 4006251 C1 4/1991

(Continued)

OTHER PUBLICATIONS

Blum, M., "Independent Unbiased Coin Flips from a Correlated Biased Source—A Finite State Markov Chain," Combinatorica, vol. 6, No. 2, pp. 97-108 (1986).

(Continued)

Primary Examiner—Tan V. Mai
(74) Attorney, Agent, or Firm—Blakely, Sokoloff, Taylor & Zafman LLP

(57) ABSTRACT

A method of producing a uniform duty cycle output from a random bit source. The method includes testing the duty cycle of said random bit source; varying the output voltage of a voltage source if the duty cycle is not substantially fifty percent; and iteratively altering the output voltage of the voltage source until said duty cycle is substantially fifty percent.

13 Claims, 5 Drawing Sheets

U.S. PATENT DOCUMENTS 6,195,433 B1    2/2001    Vanstone et al.
6,209,098 B1    3/2001    Davis
6,762,636 B1 *  7/2004    Khawshe .................... 327/175

FOREIGN PATENT DOCUMENTS

WO    WO 00/59153 A2    10/2000
WO    WO 00/59153 A3    1/2001

OTHER PUBLICATIONS

Chor, Benny, et al., "Unbiased Bits from Sources of Weak Randomness and Probabilistic Communication Complexity," SIAM Journal on Computing, vol. 17, No. 2, pp. 230-261 (Apr. 1988).

Cooper, J. Arlin, Computer Security, pp. 2072-2086 (published prior to Mar. 31, 1999).

Fairfield, R.C., et al., "An LSI Random Number Generator (RNG)," published in Proceedings in Advances in Cryptology Conference on CRYPTO, pp. 203-215 (1984).

Gude, Michael, "Concept for a High Performance Random Number Generator Based on Physical Random Phenomena," Frequenz, 39, pp. 187-190 (Jul./Aug. 1985).

Murry, Herschell F. "A General Approach for Generating Natural Random Variables," IEEE Transactions on Computers, pp. 1210-1213 (Dec. 1970).

Santha, Miklos, et al., "Generating Quasi-Random Sequences from Slightly-Random Sources," Proceedings of the 25th Annual Symposium on Foundations of Computer Science, pp. 434-440 (Oct. 24-26, 1984).

Santha, Miklos, et al., "Generating Quasi-random Sequences from Semi-random Sources," Journal of Computer and System Sciences, vol. 33, No. 1, pp. 75-87 (Aug. 1986).

von Neumann, John, "Various Techniques Used in Connection With Random Digits," Applied Mathematics Series, vol. 12, United States Department of Commerce, National Bureau of Standards, pp. 36-38 (Jun. 11, 1951).

Shift Registers, pp. 1725-1727 (published prior to Mar. 31, 1999).

U.S. Appl. No. 09/283,096, filed Mar. 31, 1999, entitled "Duty Cycle Corrector for a Random Number Generator", by Steven E. Wells and David A. Ward.

Schneler, Bruce, Applied Cryptography, John Wiley & Sons, Inc., pp. vii-xiv and 369-395 (2nd Ed., 1996).

\* cited by examiner

PROGRAMMABLE RANDOM BIT SOURCE

FIELD OF THE INVENTION

The present invention relates generally to computer security, and more specifically to generating uniform duty cycles in random number generators.

BACKGROUND OF THE INVENTION

Random number generator circuits are used in a variety of electronic applications. One important application for random number generators is in the field of computer security where messages are encrypted and decrypted. Cryptography involves the transformation of data into a coded message that is sent to and decoded by only by the intended recipient. Most common cryptographic techniques use ciphers (or "keys") used by the sender to encode the message, and by the receiver to decode the encoded message. Common cipher systems use either a single key to code and decode a message, or two keys, one to encode the message and the other to decode the message.

The keys used to encode and decode messages are basically binary data patterns against which a message is processed or filtered. Effective cipher systems require the use of keys that have a sufficiently high number of bits to make replication of a key nearly impossible. Furthermore, the data patterns comprising the keys must be sufficiently random so that their pattern or the patterns in the message encoded by the key cannot be predicted. Effective cryptographic systems thus require the use of high quality random number generators to ensure that the binary data within a message is transformed in a totally unpredictable manner. In general, any lack of randomness in an encryption scheme produces some degree of correlation between the coded and uncoded data. This correlation can then be used to crack the code through techniques such as iterative trial and error predictions of possible output patterns based on a coded message.

A desirable feature of a binary random number generator is that it output one and zero bits in a purely random order. Thus, the value of the output bit at any given time should be totally unpredictable. It is desirable that the duty cycle of the output of the random number generator be approximately fifty percent over an infinite sample size, so that the chance of an output being a logic low (zero) is equal to the chance of the output being a logic high (one). It is also desirable for a random number generator to exhibit low correlation (e.g., approximately zero correlation) between any bit and any other bit, and a flat Fourier distribution among the output bits.

Present known random number generators, however, have a tendency to generate an uneven number of zeros or ones over a statistically significant sample size. One cause of unequal duty cycles in certain prior art random number generators is the tendency of latches comprising the random number generator to favor one of the two states. Another cause of unequal duty cycles is a difference between the root-mean square value of the input clock signal and the trip points of the latches.

A common method of decreasing duty cycle variations in random number generators involves the use of a Linear Feedback Shift Register (LFSR) at the output stage of a random bit source. FIG. 1 illustrates an example of a prior art random number generator that uses a Linear Feedback Shift Register 104 coupled to the output of a random bit source 102. LFSR 104 comprises a number of latches 105 and gates 106 through which the output bits from random bit source 102 are propagated. The states of the output bits are randomly inverted by gates 106, and the order of the bits is mixed through feed-back of the bits through latches 105.

In general, Linear Feedback Shift Registers, such as that illustrated in FIG. 1, possess certain disadvantages and do not fully correct non-uniform (or non-level) duty cycle characteristics exhibited by typical random bit sources. As illustrated by LFSR 104, a typical LFSR itself comprises a number of latches and gates. These latches and gates will tend to exhibit the same propensity to latch a zero or one in certain circumstances, as the latches in the random bit source 102. Therefore, a typical LFSR does not itself produce a uniform duty cycle output of ones and zeros, and thus cannot entirely correct any duty cycle variations in a random bit source.

A further disadvantage of Linear Feedback Shift Registers is the requirement of a large number of latches and gates. For example, a 32-bit LFSR, such as shown in FIG. 1, requires 32 D-type latches, as well as a number of combinatorial gates. This adds significantly to the amount of silicon area required for a random number generator circuit that uses such an LFSR.

SUMMARY OF THE INVENTION

One embodiment of the present invention concerns a method of producing a uniform duty cycle output from a random bit source. The method includes testing the duty cycle of said random bit source; varying the output voltage of a voltage source if the duty cycle is not substantially fifty percent; and iteratively altering the output voltage of the voltage source until said duty cycle is substantially fifty percent.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A programmable random bit source is described. In one embodiment, a programmable random bit source includes a programmable voltage source, and a latch that samples a high frequency signal with a low frequency clock signal. The duty cycle of the random bit source is determined and, if not substantially fifty percent, the output voltage of the programmable voltage source is varied to adjust the trip point of the latch such that the duty cycle of the random bit source is closer to fifty percent.

It is an intended advantage of embodiments of the invention to provide a circuit that produces a uniform duty cycle for the output of a random bit source. It is a further intended advantage of embodiments of the invention to provide a random number generator that requires a reduced amount of silicon area when implemented in an integrated circuit device.

Figure 2:
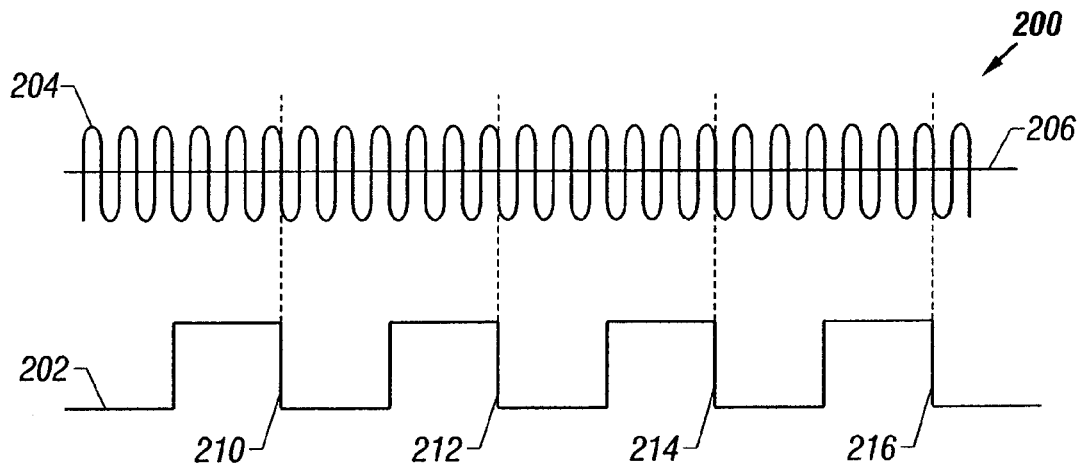
FIG. 2 illustrates one embodiment of random bit generation by latching a high speed oscillating signal with a low frequency clock signal.

One method of generating a random pattern of binary digits is to periodically latch a high speed oscillating signal with a lower speed clock signal. Depending on the state of the high frequency signal when the low frequency clock latches, a logic high (one) or a logic low (zero) bit will be produced. FIG. 2 illustrates the generation of random bits using a high-speed oscillating signal and a low speed clock. For a general random bit source, the signals represented by waveforms 200 of FIG. 2 are input to a D type latch to produce a synchronized output of digital bits.

In FIG. 2, waveform 204 represents a high frequency input signal generated by a high speed oscillator. This signal is input to the D input of a D latch. Waveform 202 represents a low frequency clock signal that is input to the clock input of the D latch such that the D latch periodically latches high speed signal 204 at various points. The latched voltage levels of signal 204 are then output from the Q output of the D latch The high frequency and low frequency signals are decoupled so that there is no direct relationship between their respective periods.

As illustrated in FIG. 2, the low frequency clock signal 202 latches the high frequency signal 204 on negative going clock pulses, 210–216. The state of the output bits for each of these pulses corresponds to the position of high speed signal 204 relative to a reference voltage level 206. For a latch-based random bit source, the reference voltage level corresponds to the trip point of the latch. If the high frequency signal is latched while the signal is above the trip point, a logic high is output. Likewise, if the high frequency signal is latched while the signal is below the trip point, a logic low is output.

Preferably, the trip point of the latch corresponds to the root mean square (RMS) value 206 of the high frequency signal 204. In this configuration, the probability of the high frequency signal being latched above the trip point is approximately equal to the probability of the high frequency signal being latched below the trip point. This will produce a random bit source in which the bit correlation between successive output bits is approximately zero, that is, the duty cycle of the output bit waveform will be substantially uniform with an even distribution of ones and zeros.

In some random bit source implementations, a random noise signal is input to the clock input of the latch through a voltage-controlled oscillator. The random noise is typically produced by a random noise source, such as thermal or semiconductor noise. This causes the period of the low frequency clock to vary from pulse to pulse, and adds further randomness to the latching of the high speed signal.

In general, however, most present latch-based random bit sources exhibit some non-uniformity in duty cycle. Such non-uniformity is typically due to several factors. One of the main causes of a non-uniform duty cycle is the tendency of the D latch to latch a particular logic level when data is latched during a forbidden hold or setup time. A second cause of a non-uniform duty cycle is a difference between the RMS value of the high frequency input signal and the trip point of the latch. Another cause may be a non-uniform duty cycle within the high speed oscillator.

Figure 3:
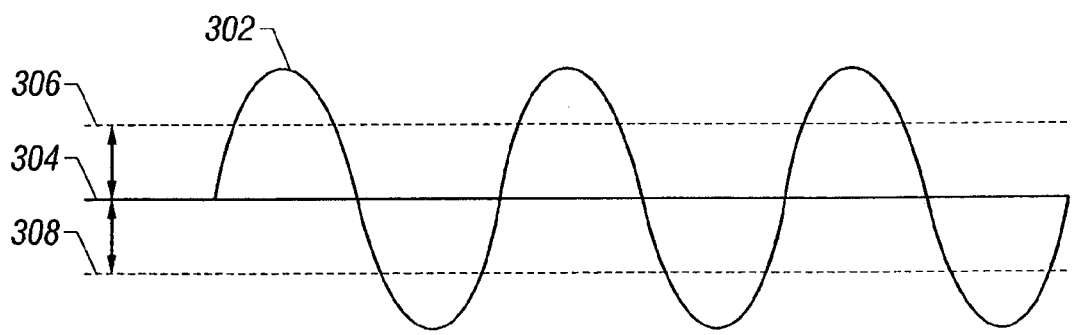
FIG. 3 illustrates that varying the trip points of a latch can affect the duty cycle output from a random bit source.

FIG. 3 illustrates that the trip point of a latch can affect the duty cycle of a random bit source. The RMS level for high frequency signal 302 is shown as line 304. If the trip point of the latch used to latch high frequency signal 302 corresponds to line 306, very few logic high bits will be output compared to the number of logic low bits. Likewise, if the trip point of the latch corresponds to line 308, very few logic low bits will be output compared to the number of logic high bits. In one embodiment of the present invention, a programmable voltage source is used to vary the trip point of the latch to correspond to the RMS level of the high frequency signal.

Figure 4:
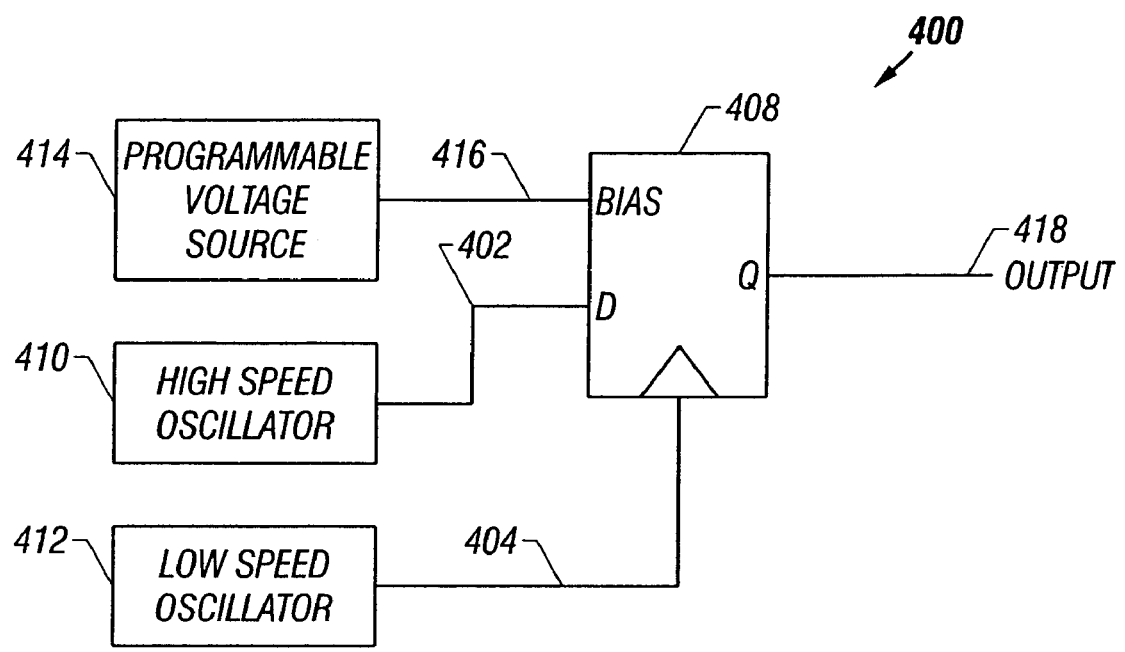
FIG. 4 is a block diagram of one embodiment of a random bit source.

FIG. 4 illustrates one embodiment of a programmable random bit source that incorporates a programmable or alterable voltage source to vary the trip point of a latch for the latching of a high frequency signal. Programmable random bit source 400 comprises a D latch 408 which outputs a random distribution of bits from Q output 418. A high speed oscillator 410 is coupled to the D input of D latch 408, and produces a high frequency signal 402 (e.g., signal 204 in FIG. 2). A low speed oscillator is coupled to the clock input of D latch 408, and produces a low frequency clock signal 404 (e.g., signal 202 in FIG. 2). Programmable random bit source 400 also includes a programmable voltage source 414 (e.g., a voltage trim circuit) coupled to a bias input to D latch 408. The programmable voltage source is configured to vary the trip point of D latch 408 so that high frequency signal 402 is latched by low frequency signal 404 at a desired voltage level of the high frequency signal 402. For one embodiment, the programmable voltage source is configured to vary the trip point of D latch 408 so that high frequency signal 402 is latched by low frequency signal 404 at the RMS voltage level of the high frequency signal 402.

In one embodiment, latch 408 has a variable trip point. The trip point may be adjusted through a bias circuit included within the latch and controlled by a programmable voltage level output by programmable voltage source 414. Alternatively, a separate bias circuit may be provided that controls the trip point of latch 408 through an input voltage level or similar control signal. The function of such a bias circuit is to adjust the voltage level of the low trip point of latch 408 to a desirable level.

Figure 10:
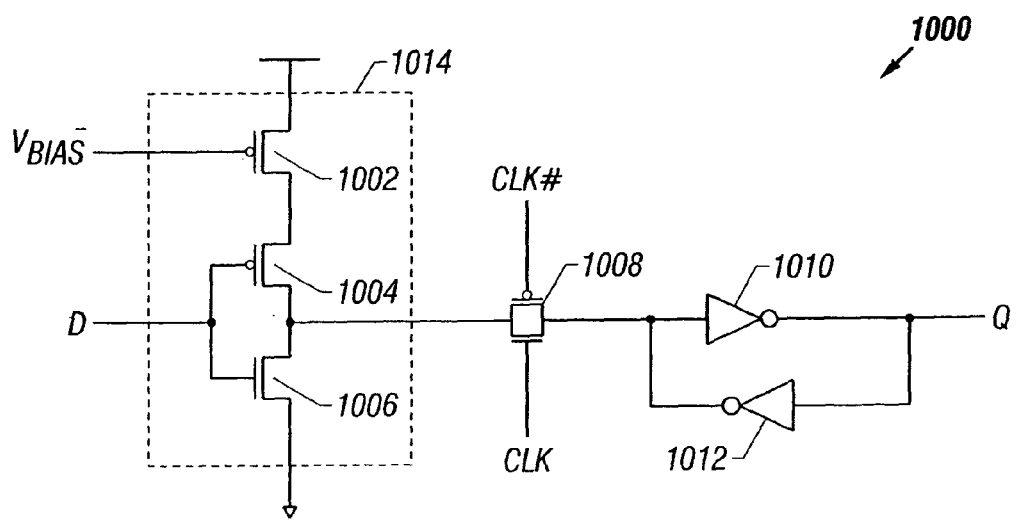
FIG. 10 is a circuit diagram of one embodiment of a latch having a bias circuit.

FIG. 10 shows latch 1000 that is one embodiment of latch 408 including a bias circuit. Latch 1000 includes bias circuit 1014, CMOS transmission gate 1008, and cross-coupled inverters 1010 and 1012. Bias circuit 1014 includes PMOS transistor 1004 and NMOS transistor 1006 coupled in an inverter arrangement with their gate terminals receiving input data for the latch, and their drain terminals coupled to transmission gate 1008. Bias circuit 1014 also includes PMOS transistor 1002 coupled in series between PMOS transistor 1004 and a power supply voltage. The gate of PMOS transistor 1002 is coupled to a bias voltage (VBIAS) provided by programmable voltage source 414. The trip point of transistor pair 1004 and 1006 may be altered by adjusting VBIAS such that the amount of current supplied to transistor pair 1004 and 1006 is controlled. The voltage output by transistor pair 1004 and 1006 is clocked through transmission gate 1008 by CLK (and its complement CLK#) and latched into cross-coupled inverters 1010 and 1012. Other embodiments of a D latch may be used.

Figure 8:
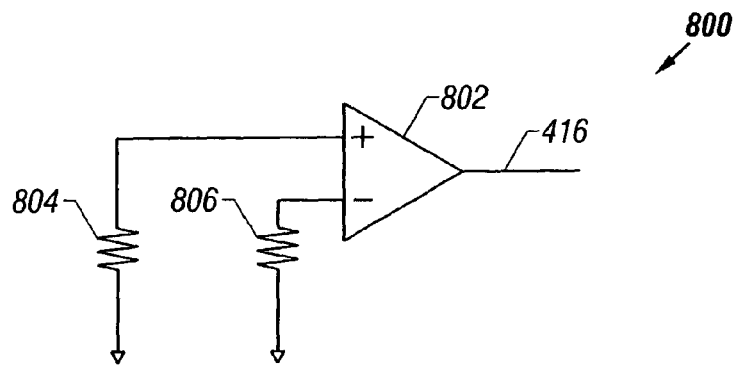
FIG. 8 is a circuit diagram of one embodiment of the programmable voltage source of FIG. 4.

Many different types of programmable or alterable voltage sources may be used for programmable voltage source 414. FIG. 8 shows programmable trim circuit 800 that is one embodiment of programmable voltage source 414. Programmable trim circuit 800 is an analog circuit that includes differential amplifier 802 and resistors 804 and 806. The non-inverting input of amplifier 802 is connected to ground through pull-down resistor 804, and the inverting input of amplifier 802 is connected to ground through pull-down resistor 806. An analog tuning technique can be implemented by varying the amount of current through the pull down resistors 804 and 806. When the current through pull down resistor 804 is varied, the voltage level input to the non-inverting terminal of amplifier 802 is varied. Similarly, when the current through pull-down resistor 806 is varied, the voltage level input to the inverting terminal of amplifier 802 is varied. In this manner, the output voltage from amplifier 802 can be adjusted. This variable output voltage is then input into a bias input of D latch 408. By adjusting the variable output voltage in amplifier 802, the trip point of D latch 408 can be increased or decreased accordingly.

The current through the resistors can be varied by varying the resistance of each resistor. This may be accomplished, for example, through use of a laser trimming techniques (e.g., fuses), mask options, or using other programmable circuit elements (e.g., programmable memory elements) to selectively remove or add resistors in parallel or series with resistors 804 and 806.

Figure 9:
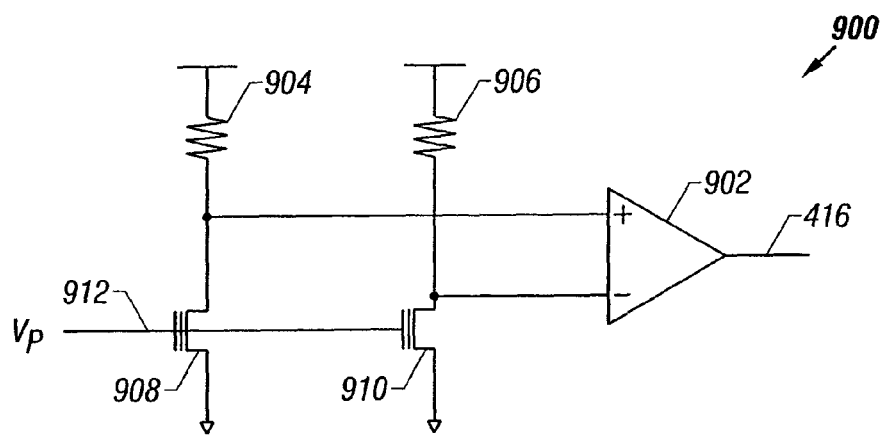
FIG. 9 is a circuit diagram of another embodiment of the programmable voltage source of FIG. 4.

FIG. 9 shows circuit 900 that is an alternative embodiment of programmable voltage source 414. Circuit 900 is an analog circuit that includes flash memory pair 908 and 910. Flash memory devices utilize a single transistor cell to store one or more bits of data as a function of the amount of charge stored on their floating gates. One important characteristic of flash memory cell is that it is a nonvolatile memory device that retains data even in the absence of a supply voltage. Another important characteristic of a flash memory cell is that the threshold voltage of the transistor can be easily programmed, read, and/or erased.

Flash memory cells 908 and 910 have their control gates coupled to receive a programming voltage VP on signal line 912. The drain of flash memory cell 908 is coupled to a power supply voltage by resistor 904 (or any other current source circuitry), and is also coupled to the non-inverting input of differential amplifier 902. Similarly, the drain of flash memory cell 910 is coupled to the power supply voltage by resistor 906 (or any other current source circuitry), and is also coupled to the inverting input of differential amplifier 902. Amplifier 902 senses the difference in the voltage levels at the drains of the flash memory cells and provides an indication of this difference as a voltage level to signal line 416. The drain voltages induced on flash memory cells 908 and 910 are a function of the programmed threshold voltages of the cells. The threshold voltage of each flash memory cell can be individually programmed and/or erased to achieve a desired increase or decrease in the drain voltages. Thus, the drain voltages and the output voltage at signal line 416 can be tuned or programmed to any desirable voltage level.

For certain manufacturing processes, the reference voltage measuring the RMS value of the high frequency input signal may be on the order of 1.0 V to 3.3 V. For this reference voltage range, the output voltage of amplifier 902 may be varied on the order of ±10 mV, depending on the type of devices used, among other factors. The use of flash memory devices allows the bias voltage to be adjusted up or down, and also allows the bias voltage to be set in a non-volatile manner.

Figure 5A:
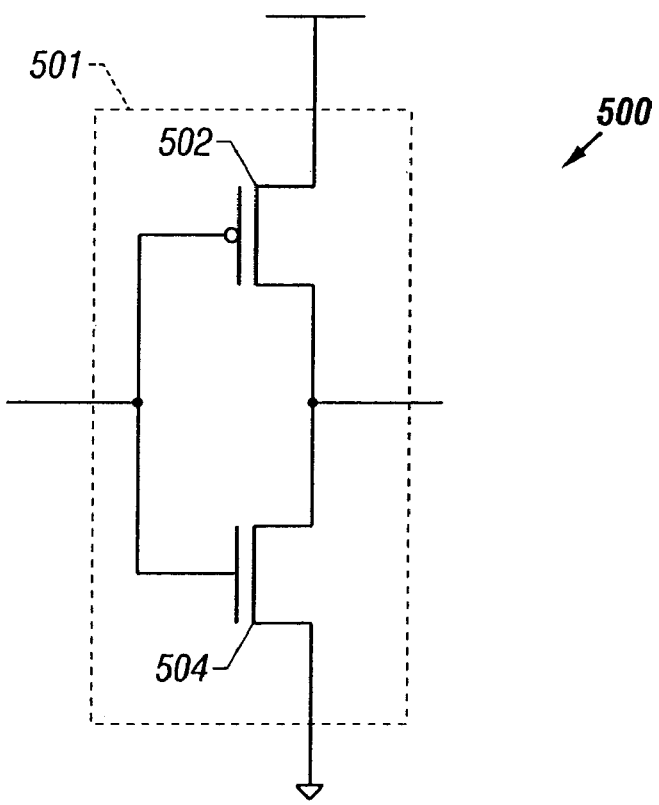
FIGS. 5A–5C are embodiments of the programmable voltage source of FIG. 4.
Figure 5B:
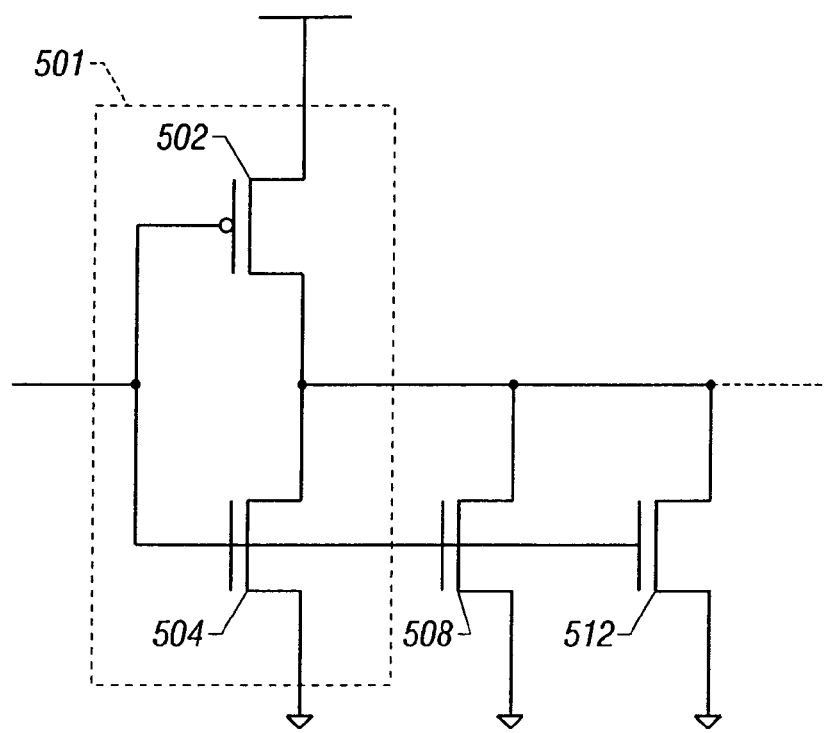
Figure 5C:
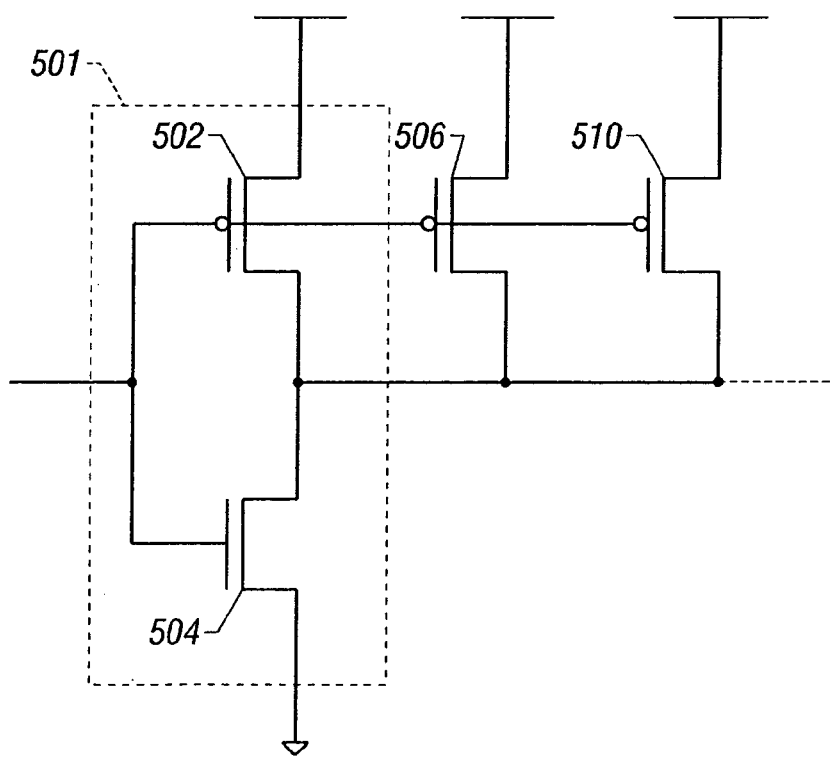

A digital tuning technique can also be used to implement programmable voltage source 414. For example, one or more CMOS inverters may be used as shown in FIGS. 5A–5C. For other embodiments, other logic gates may also be used.

Circuit 500 of FIG. 5A includes a CMOS inverter 501 having PMOS transistor 502 and NMOS transistor 504. If both transistors are fabricated with identical current gain characteristics (also referred to as the beta of the transistor), then the output voltage of circuit 501 is approximately $V_{CC}/2$. The transistors may also be fabricated having different current gain characteristics to produce any desirable trimmed voltage. By selectively adding additional pull-up and pull-down transistors, the output voltage can be varied as a proportion of $V_{CC}$. For example circuit 500 may be expanded through the addition of a number of additional PMOS pull-up transistors, such as transistors 506 and 510 of FIG. 5C. Circuit 500 may also be expanded through the addition of a number of additional NMOS pull-down transistors, such as 508 and 512 of FIG. 5B. The number and type of transistors added can determine the output voltage of circuit 500.

For example, if additional NMOS transistors 508 and 512 are added to input pair 501, as shown in FIG. 5B, the output voltage can be varied to any voltage level. If transistors 508 and 512 have the same current gain characteristics as those of transistors 502 and 504, the trimmed output voltage is equal to approximately $V_{CC}/4$. For other embodiments, the current gain characteristics of transistors 508 and 512 may be any other values such that any amount of Vcc may be output by the circuit of FIG. 5B. Transistors 508 and 512 may be selectively added or removed from the circuit through programmable circuit elements such as fuses (e.g., laser, metal, electrical), masks, or programmable memory elements.

In another example, if additional PMOS transistors 506 and 510 are added to input pair 501, as shown in FIG. 5C, the output voltage can be varied to any voltage level. If transistors 506 and 510 have the same current gain characteristics as those of transistors 502 and 504, the trimmed output voltage is equal to approximately $3V_{CC}/4$. For other embodiments, the current gain characteristics of transistors 505 and 510 may be any other values such that any amount of Vcc may be output by the circuit of FIG. 5C. Transistors 506 and 510 may be selectively added or removed from the circuit through programmable circuit elements such as fuses (e.g., laser, metal, electrical), masks, or programmable memory elements.

The operation of programmable random bit source 400 of FIG. 4 is as follows. The duty cycle of latch 408 is first determined with the output of programmable voltage source 414 set to a neutral or default level (e.g., after reset or power-up). In this case, latch 408 is effectively untrimmed. The output of the programmable voltage source 414 may be monitored by an external tester (e.g., automatic test equipment or "ATE"), other external monitoring circuitry, or by circuitry included in a device with random bit source 400. If the duty cycle is other than approximately 50 percent, the output voltage of programmable voltage source 414 is adjusted. For example, the monitoring circuitry may send one or more control signals to the programmable voltage source or to another circuit to adjust the output voltage from the programmable voltage source (e.g., add or subtract resistors as in FIG. 8, program or erase flash memory cells as in FIG. 9, or add or remove transistors as in FIGS. 5B and 5C). This causes the trip point of latch 408 to change accordingly. At this point, the duty cycle of latch 408 is again tested. If the duty cycle is still non-uniform, the output voltage of programmable voltage source 414 is further adjusted. This trial-and-error iterative process of testing the duty cycle, varying the trip point, re-testing the duty cycle is continued until the duty cycle of the latch is approximately 50 percent, or as close as desired to 50 percent. Through this method, the duty cycle of the latch is effectively "tuned" by varying the bias input of the D latch to change the point at which the high frequency signal 402 is latched.

In an alternative method, the duty cycle of latch 408 may be corrected automatically instead of through the iterative method described above. For this embodiment, the non-uniformity of the duty cycle of the untrimmed latch is measured. The variation in duty cycle yields a factor which can be used to determine the adjustment required in the trip point of the latch. This adjustment level is then be translated into a voltage level which is used to determine the adjustment required in the output voltage of programmable voltage source 414. The analog or digital tuning methods described above are then used to adjust the output voltage of programmable voltage source 414 accordingly.

Figure 1:
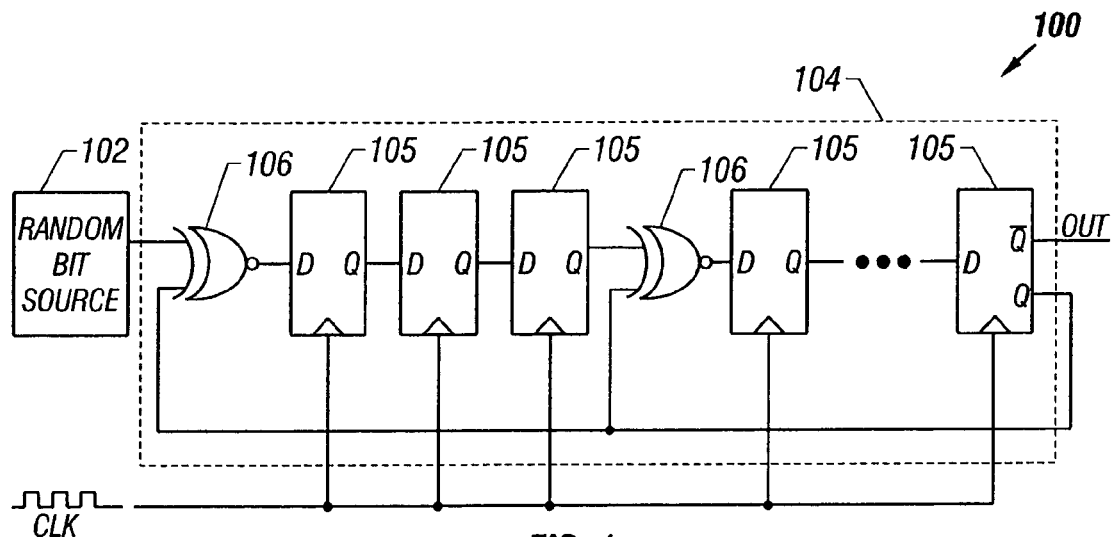
FIG. 1 is a conventional random number generator using a Linear Feedback Shift Register.

Advantageously, programmable random bit source 400 can be implemented in a much smaller silicon space then a typical Linear Feedback Shift Register circuit (such as that illustrated in FIG. 1) because there is no need for a latch per bit output by the random bit source.

Figure 6:
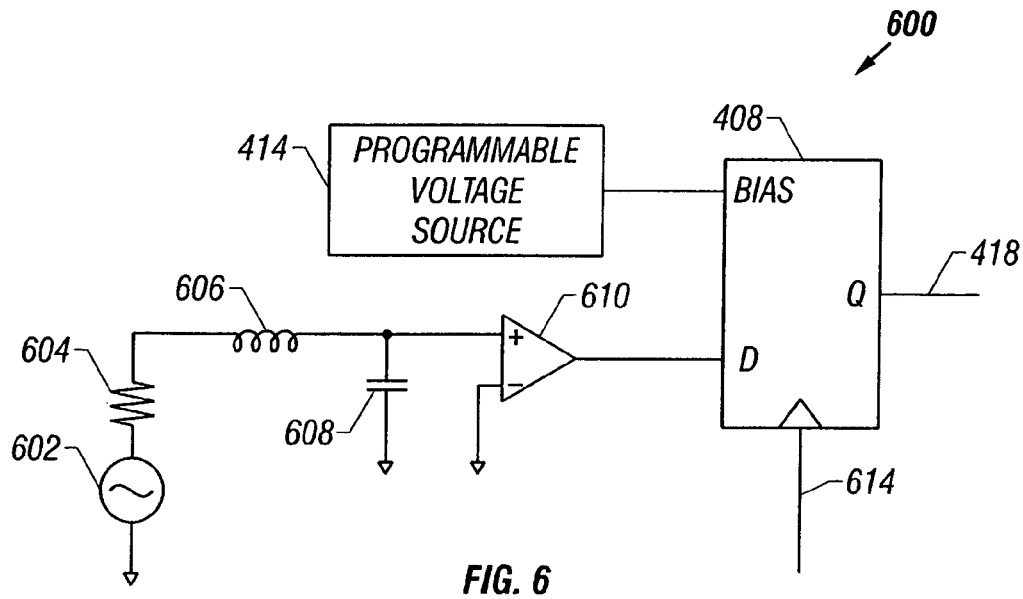
FIG. 6 is a block diagram of another embodiment of a random bit source.

FIG. 6 illustrates another embodiment of a programmable random bit source 600. Source 600 is a non-deterministic programmable random bit source that includes latch 408 and programmable voltage source 414 as in FIG. 4, but has replaced the high speed oscillator with a noise source 602 coupled to comparator circuit 610 through a resistor 604, inductor 606, and capacitor 608. Noise source 602 may be a random noise source, such as thermal or semiconductor noise. The output of comparator 610 is input to latch 408 which is activated by strobe signal 614 to produce digital output 418. The strobe signal may be a clock signal or other signal transition including the low frequency oscillator of FIG. 4.

Figure 7:
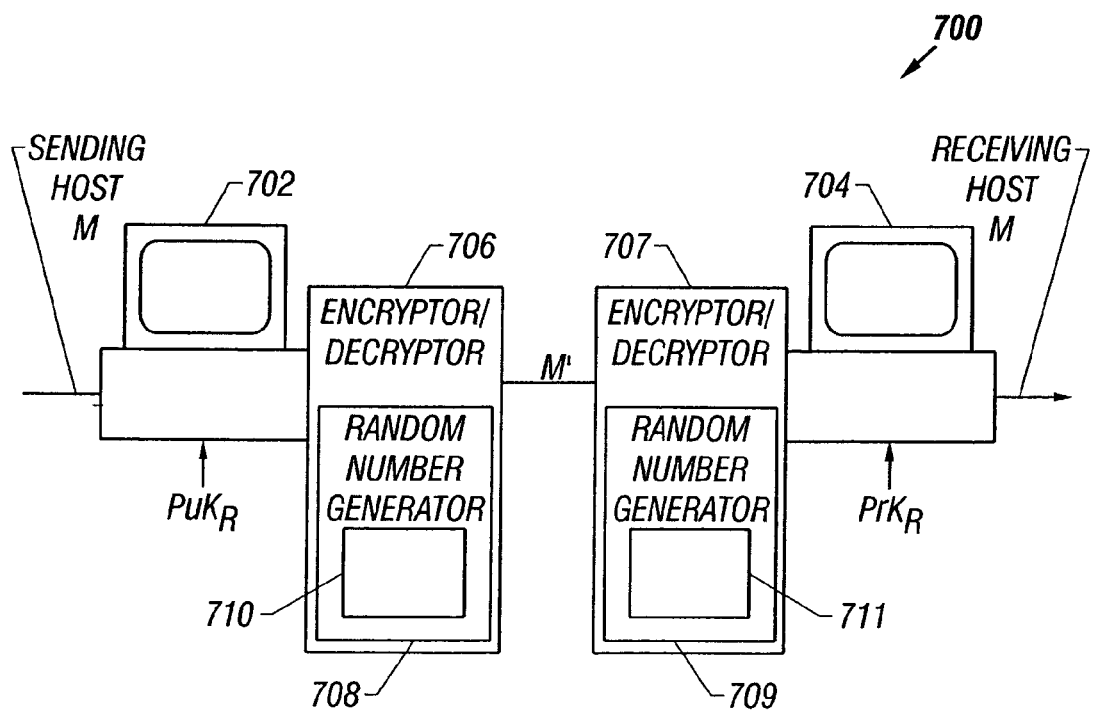
FIG. 7 is a block diagram of a computer system including a random number generator incorporating a random bit source.

The programmable random bit source previously described above is used in conjunction with a random number generator used to code and decode messages sent over a computer network. FIG. 7 is a block diagram of a computer network for transmitting such encrypted messages. Network 700 includes a sending host computer 702 coupled to a receiving host computer 704 over a network. Both the sending host computer and the receiving host computer contain network interface devices that provide the physical and logical connections between host computer systems and the network medium. Both host computers also contain encryptor/decryptor circuits that perform various cryptographic functions for secure data communication. Sending host 702 includes encryptor/decryptor circuit 706, and receiving host 704 includes encryptor/decryptor circuit 707. The encryptor/decryptor circuits 706 and 707 both include random number generators 708 and 708 that each employ programmable random bit sources 710 ad 711, respectively, such as those of FIGS. 4 and 6. The random number generators are used to generate the public/private key pairs in public/private key systems.

Various methods of data encryption may be used in network 700 to ensure secure communications between sending host 702 and receiving host 704. In one embodiment of the present invention, network 700 uses a public key (asymmetric) cryptographic system. In a public key system, two different keys are used. One key is used by the sender to encode a message and the other key is used by the receiver to decode the coded message. In this system, the encryption (public) key may be widely published, but the decryption (private) key must be kept secret so that only the intended receiver can decode the message. The public and private keys are typically derived together from very large primes and random numbers. Thus, effective random number generators are required to produce truly random key pairs.

In an example of a data transfer using a public key system, sending host 702 composes a message M for transmission to receiving host 704. The two keys used for the transmission comprise the receiver's public key ($PuK_R$), and the receiver's private key ($PrK_R$). The receiver typically selects a public key from a publicly available register of keys, and derives the private key from the public key through a transformation process known only to the receiver. Thus, the correlation between the public key and private key is generally secret and secure. Using the public key, the sending host 702 encodes the message through encryptor/decryptor circuit 706 to create an encoded message M'. Once encoded, only the appropriate private key can decode the message. Upon receiving the message, receiving host 704 decodes the message M' with the private key to recover the original message M.

In one embodiment of the present invention, encryptor/decryptor circuit 707 in receiving host 704 includes random number generator 709 that employs programmable random bit source 711. This technique ensures that the bit distribution from random number generator 709 is sufficiently level and random so that there is no consistent correlation between private and public keys produced by receiving host 704. As shown in network 700, encryptor/decryptor circuit 706 in sending host 702 also includes a random number generator 708 and programmable random bit source 710. This allows sending host 702 to generate secure private keys and public keys when it employs public key transmission. A high degree of randomness is required in generating the key pair so as to make a non-exhaustive search of private keys exceedingly difficult.

In an alternative embodiment of the present invention, network 700 uses a single key (symmetric) system to perform cryptographic functions. In a single-key system, one key is used by both the sender to encrypt the message and by the receiver to decrypt the coded message. This system relies on the secrecy of the key. Therefore, a secure process is required for disclosure of the key only between the sender and receiver and no other party. For this embodiment, different keys are typically used for different message transactions. Thus, generation of the various keys requires a random process to ensure that a key used for one message transaction cannot be determined from any key used for any other message transaction. For this system the random number generators within the encryptor/decryptor circuits in each of the host computers of network 700 are used to generate the random key patterns for encoding and decoding the message data transmitted between the host computers.

It should be noted that, although embodiments of the present invention have been discussed in relation to single key and public/private key encryption systems, embodiments of the present invention may be used for random number generation in other types of cryptographic systems for secure computer networking. Moreover, the encryptor/decryptor circuits illustrated in FIG. 7 may be used in a secure data transmission systems to perform various cryptographic functions such as coding and decoding of messages, authentication of transmitted messages, verification of digital signatures, and other such functions.

In the foregoing, a circuit has been described for producing a uniform duty cycle random number generator. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method comprising:
   testing a duty cycle of a random bit source;
   varying an output voltage of a voltage source if the duty cycle has not substantially reached a first threshold; and
   iteratively altering the output voltage of the voltage source until the duty cycle has not substantially reached the first threshold.

2. The method of claim 1 further comprising:
   periodically latching a high frequency signal in response to a low frequency signal; and
   outputting one or more binary digits corresponding to a voltage level of the latching high frequency signal.

3. The method of claim 1 wherein varying the output voltage of the voltage circuit further comprises updating a threshold voltage of a flash memory cell in the voltage circuit.

4. The method of claim 1 wherein varying the output voltage of the voltage circuit further comprises:
   varying an input current to a non-inverting input of a differential amplifier to produce a first input voltage; and
   varying an input current to an inverting input of the differential amplifier to produce a second input voltage.

5. The method of claim 1 wherein varying the output voltage of the voltage circuit further comprises altering the number of transistors in the voltage circuit determining the output voltage.

6. The method of claim 1 wherein the method of producing a uniform duty cycle output from a random bit source is used in a random number generator operable to produce random binary numbers for use in a cryptographic system for secure communications between a plurality of computers in a network.

7. The method of claim 1 wherein the first threshold is fifty percent.

8. A random bit source comprising:
   a latch to produce a uniform duty cycle output;
   a component to test the duty cycle; and
   a programmable voltage source to vary an output voltage if the duty cycle has not substantially reached a first threshold and iteratively alter the output voltage until the duty cycle has not substantially reached the first threshold.

9. The random bit source of claim 8 wherein the programmable voltage source comprises a flash memory cell, wherein varying the output voltage of the voltage circuit further comprises updating a threshold voltage of the flash memory cell.

10. The random bit source of claim 8 wherein the programmable voltage source further comprises differential amplifier, wherein varying the output voltage of the programmable voltage source further comprises varying an input current to a non-inverting input of the differential amplifier to produce a first input voltage and varying an input current to an inverting input of the differential amplifier to produce a second input voltage.

11. The random bit source of claim 8 wherein varying the output voltage of the programmable voltage source further comprises altering the number of transistors in the programmable voltage source determining the output voltage.

12. The random bit source of claim 8 wherein producing a uniform duty cycle output from the random bit source is used in a random number generator operable to produce random binary numbers for use in a cryptographic system for secure communications between a plurality of computers in a network.

13. The random bit source of claim 8 wherein the first threshold is fifty percent.

* * * * *